United States Patent [19]

Ooshio et al.

[11] Patent Number: 4,645,218
[45] Date of Patent: Feb. 24, 1987

[54] ELECTROSTATIC CHUCK

[75] Inventors: Hirosuke Ooshio; Osamu Watanabe, both of Zama, Japan

[73] Assignee: Kabushiki Kaisha Tokuda Seisakusho, Zama, Japan

[21] Appl. No.: 760,512

[22] Filed: Jul. 30, 1985

[30] Foreign Application Priority Data

Jul. 31, 1984 [JP] Japan .................. 59-117493

[51] Int. Cl.⁴ ............................... B25B 11/00
[52] U.S. Cl. .................. 279/1 M; 269/8; 269/13; 361/145; 361/234
[58] Field of Search ............... 361/145, 234; 29/DIG. 95; 269/8, 13; 279/1 M, 1 R

[56] References Cited

U.S. PATENT DOCUMENTS

| | | | |
|---|---|---|---|
| 4,184,188 | 1/1980 | Briglia | 361/234 |
| 4,384,918 | 5/1983 | Abe | 361/234 X |
| 4,502,094 | 2/1985 | Lewin et al. | 269/8 X |
| 4,554,611 | 11/1985 | Lewin | 361/234 |

FOREIGN PATENT DOCUMENTS

| | | | |
|---|---|---|---|
| 56-85828 | 7/1981 | Japan . | |
| 58-190037 | 11/1983 | Japan | 269/8 |
| 1443215 | 7/1976 | United Kingdom | 269/8 |

Primary Examiner—Gil Weidenfeld
Assistant Examiner—Steven C. Bishop
Attorney, Agent, or Firm—Schwartz, Jeffery, Schwaab, Mack, Blumenthal & Evans

[57] ABSTRACT

An electrostatic chuck for holding a work by electrostatic forces, which has an electrostatic attraction body for attracting the work, an electrostatic conductive support body for supporting the electrostatic attraction body, channels for passing cooling medium therethrough and cover means for covering the exposed surfaces of the support body except a portion thereof over which the work is placed. This chuck can not only prevent impure matters from generating from the surfaces of the support body but also prevent damages due to heat.

16 Claims, 6 Drawing Figures

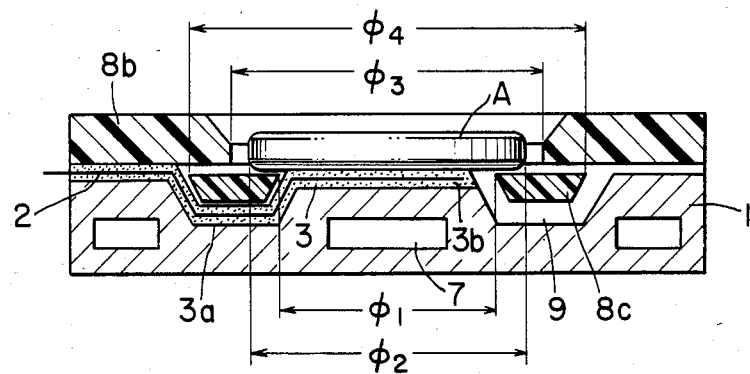
F I G. 4
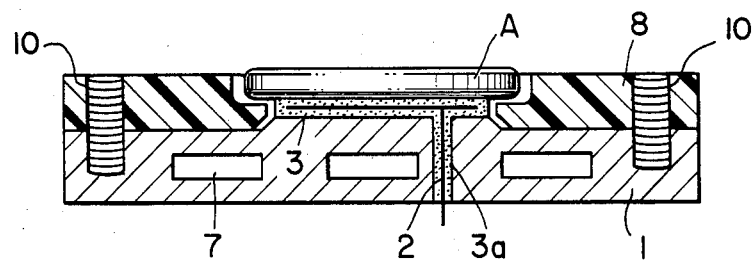
F I G. 5
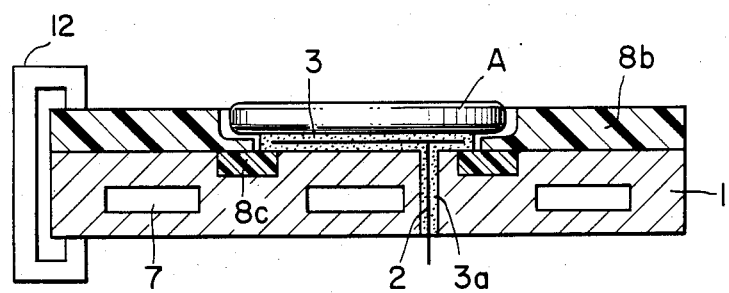
F I G. 6

ELECTROSTATIC CHUCK

BACKGROUND OF THE INVENTION

This invention relates to an electrostatic chuck and more particularly to an improved electrostatic chuck for securing a work by electrostatic forces in a vacuum process apparatus such as a dry-etching apparatus.

In a vacuum microfabrication apparatus such as a dry-etching apparatus, a variety of means for securing a wafer have been used. In recent years electrostatic chucks are used for securing a specimen wafer by electrostatic forces.

Japanese Patent Laid-Open Publication No. 85828/1981 discloses an electrostatic chuck of a type which has a holding portion for holding a wafer. The holding portion is so formed that its size is almost the same as that of a wafer to be processed. The holding portion comprises a first insulator layer, a plurality of electrodes provided upon the first insulator layer, and a second insulator layer provided upon the plurality of electrodes and over the first insulator layer. The other portion except the holding portion consists of a metal support body such as a stainless steel member.

In operation, the specimen wafer is placed over the holding portion of the electrostatic chuck. When a high voltage is applied to the electrodes, the electrostatic attractive forces arise and attract and securely hold the specimen wafer in position. A vacuum process such as etching is done thereafter.

The above described electrostatic chuck can prevent wear and degradation of the second insulator layer contacting directly the wafer since the holding portion is entirely covered by the specimen wafer. However, though the insulator layer is protected from wearing, the upper surface of the metal support body is subjected to an etching process, with a result that the metallic material of the support body may disperse or scatter as impurities.

In addition, although a high temperature during the etching process often has an adverse effect on the wafer, no consideration has been made to mitigate heat impacts regarding the electrostatic chuck.

SUMMARY OF THE INVENTION

It is an object of the present invention to provide an electrostatic chuck capable of holding a work by electrostatic forces without dispersing impure matters from a metallic support body and of preventing damages due to high heat.

In one aspect of the present invention, the electrostatic chuck includes an electrostatic attraction body having an electrode and an insulator layer which buries the electrode therein. The electrostatic attraction body attracts the work on its upper surface. The electrostatic chuck further includes below the electrostatic attraction body an electric conductive metal support body for supporting the lower surface of the electrostatic attraction body. The chuck has also channels for passing cooling medium such as cooling water either in the metal support body or in the electrostatic attraction body, an electric connection portion for supplying voltage across the electrode, and cover means placed at least on the same side as the electrostatic attraction body with respect to the metal support body for covering the generation of impure matters from the exposed surfaces of the metal support body other than a portion on which the work is attracted.

In another aspect of the invention, the insulator layer is formed of thin films, the cover means is made of either a ceramic material or a heat resistant resin, and the metal support body is formed of a material with a sufficiently high thermal conductivity.

The present invention is further described with the aid of the accompanying drawings, which illustrate preferred embodiments by way of an example only. The nature, utility and features of this invention will be more clearly apparent from the following detailed description with respect to the preferred embodiments when read in conjunction with the accompanying drawings briefly described below.

BRIEF DESCRIPTION OF THE DRAWINGS

In the accompanying drawings:

FIGS. 4, 5 and 6, respectively, show a second, third and fourth embodiments in accordance with the present invention.

DETAILED DESCRIPTION OF THE PREFERRED EMBODIMENTS

Figure 1:
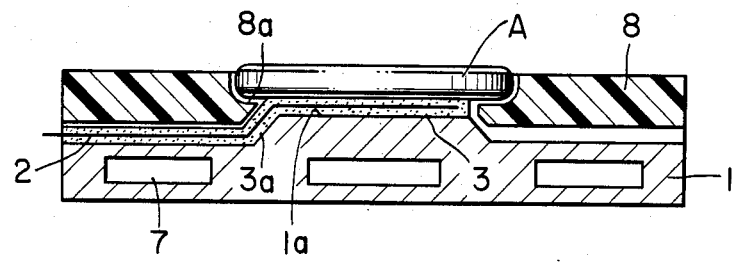
FIG. 1 is an elevational sectional view of the electrostatic chuck and a specimen wafer placed thereon.

Referring first to FIG. 1 in accordance with the first embodiment of the present invention, an improved electrostatic chuck with a specimen wafer A as a work placed thereon, includes an electrically conductive support body 1 at the bottom of the chuck. The support body 1 has, at its center, a round protrusion 1a with the thickness slightly greater than the rest of the body 1. The support body 1 is made of a material with a high conductivity such as copper or aluminum. To the upper surface of the protrusion 1a of the support body 1 is applied an electrostatic attraction body 3 in which a metallic electrode 2 is accommodated.

Figure 2:
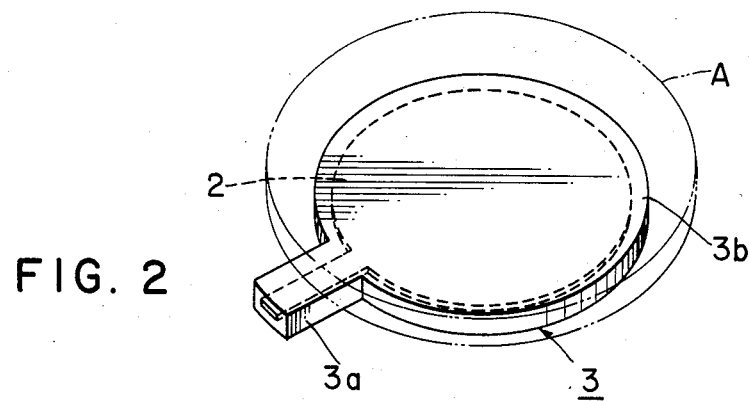
FIG. 2 is a perspective view of the electrostatic chuck and the specimen wafer as shown in FIG. 1.
Figure 3:
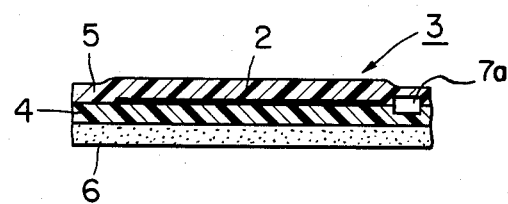
FIG. 3 is an enlarged elevational sectional view of the electrostatic attraction body shown in FIG. 1.

Referring next to FIGS. 2 and 3, the construction of the attraction body 3 will be explained in detail. The body 3 comprises an insulator layer and an adhesive layer 6. The insulator layer has an insulator base film 4 and a insulator cover film 5. The insulator layer is made of an organic resin layer with the thickness of 10 to 100 $\mu$m, such as a polyimide layer or a polyester layer. To the insulator base film 4 made of polyimide or polyester is applied the electrode 2 made of, for example, copper film with the thickness of 10 to 50 $\mu$m. After the electrode 2 is formed in a preselected form, the insulator cover film 5 made of polyimide or polyester is applied to the electrode 2, placing the electrode 2 between the insulator cover film 5 and the insulator base film 4. Further, on the bottom of the insulator base film 4 is provided the adhesive layer 6.

The electrode 2 may be made of a metallic film with the thickness of less than 2 $\mu$m, formed on the insulator base film 4 or the insulator cover film 5 by means of vacuum evaporation or sputtering.

In this embodiment, for example, the thicknesses of both the insulator base film 4 and the insulator cover film 5 are 50 $\mu$m, respectively, the thickness of the copper-made electrode 2 is 18 $\mu$m, the adhesive layer 6 is 40 $\mu$m, and the entire thickness of the electrostatic attraction body 3 amounts to 158 $\mu$m. It is desirable that the body 3 is formed as thin as possible in order to increase heat transmission efficiency. Both the electrostatic attraction body 3 and the specimen wafer A have circular shapes, respectively. However, the electrostatic attraction body 3 has an attracting surface slightly smaller than the surface, to be attracted, of the specimen wafer A. A portion of the periphery of the electrostatic attraction body 3 is so projected from its circular main body 3b as to form an electric connection portion 3a for connecting the electrode 2 with an external power supply, not shown.

Referring back to FIG. 1, through the support body 1, there are provided a plurality of channels 7 for passing cooling medium therethrough in order to cool the wafer A. Such channels may be formed in the electrostatic attraction body 3 (shown at 7a in FIG. 3). The electrostatic chuck according to the present invention is further provided with a cover plate 8 applied onto the support body 1 by means of an adhesive The cover plate 8 has a round aperture 8a at its center for placing the wafer A therein. The cover plate 8 can cover the exposed surfaces except the surface of the protrusion 1a on which the wafer A is placed and is formed of a ceramic material such as carbon, quartz, alumina, silicon carbide (SiC), or silicon nitride (SiN), etc. The cover plate 8 may be formed of a heat-resistant synthetic resin such as polyimide or fluoreoresin, etc. Further, the cover plate 8 may be fixed to the support body 1 by means of screws (see element 10 in FIG. 5). In addition, the cover plate 8 may be simply placed or clamped upon the support body 1 by means of a clamping member provided on the periphery of the cover means (See element 12 in FIG. 6).

In accordance with the above-described first embodiment, in operation, the specimen wafer A is placed upon the electrostatic attraction body 3, and thereafter a DC voltage is applied to the electrode 2. The wafer A is thus attracted by means of electrostatic forces and is secured on the electrostatic attraction body 3. The electrostatic chuck described above is placed in a vacuum chamber, and a vacuum process such as etching operation, etc. is carried out for the specimen wafer A. In the meantime, cooling water is provided through the channels 7 during the processing.

It is to be understood that loading and unloading of the speciment wafer A on the electrosatic chuck are done by a loader mechanism, not shown, which is provided through the support body 1 and which is capable of vertically lifting and lowering the wafer A through the support body 1. The electrostatic attraction body 3 and the support body 1 are provided with apertures (not shown) to permit the vertical movements of the lifting mechanism, respectively.

Accordingly, with the aforementioned construction of the electrostatic chuck in accordance with this invention, since the exposed surface of the support body 1 except the surface of protrusion 1a on which the wafer A is placed is covered with the cover plate 8, the material of the support body is no longer directly hit by ion beams nor scattered during an etching process. In addition, no impure materials are generated in the vacuum processing chamber.

Moreover, with the aid of cooling water passing through the channels in the support body 1, the support body 1 is cooled off desirably and consequently the specimen wafer A does not suffer damage due to heat.

In FIG. 4, an electrostatic chuck according to a second embodiment of the current invention is shown. In the embodiment, an annular groove 9 is formed around the entire periphery of the central protrusion 1a of the support body 1. As is the case with respect to the first embodiment, an electrostatic attraction body 3 is fixed to the upper surface of a round protrusion 1a formed by digging an annular groove 9. An electric connection portion 3a is projected from the main body 3b of the attraction body 3 and extended across the groove 9.

Over the whole upper surfaces of the support body 1 and the groove 9, with the exception of the circular protrusion upon which the specimen wafer A is to be placed, a cover plate 8b and a cover ring 8c are placed, respectively.

In this embodiment, the preferred relationships with regard to the dimensions of the elements are:

$$\phi_1 < \phi_2$$

$$\phi_2 < \phi_3$$

$$\phi_3 < \phi_4$$

where
  $\phi_1$: the internal diameter of the cover ring 8c placed in the groove 9,
  $\phi_2$: the diameter of the specimen wafer A,
  $\phi_3$: the internal diameter of the cover plate 8b, and
  $\phi_4$: the external diameter of the cover plate 8b.

It is apparent that in accordance with the second embodiment it is also possible, by means of the two pieces of the cover members 8b, 8c, to prevent the material of the support body 1 from dispersing or scattering, by keeping the ion beam impacts away from the support body 1. The embodiment also ensures satisfactory cooling effects by the cooling water passing through the channels 7.

Referring to FIG. 5 illustrating the third embodiment of the current invention, an electrostatic chuck includes an electrostatic attraction body 3 which has an electric connection portion 3a extending downward through the support body 1 for an electrical connection. This structure enables the electrostatic chuck to be connected to a power source directly below the support body 3. This construction also ensures to prevent ion beam from attacking the upper surface of the support body 1.

Referring next to FIG. 6, the electrostatic chuck in accordance with the fourth embodiment of the invention includes a cover ring 8c provided immediately below the adjoining portion of a cover plate 8b and the electrostatic attraction body 3. The provision of the cover members 8b, 8c further ensures to prevent ion beam from hitting the upper surface of the support body 1. Naturally, the fourth embodiment also ensures the electrostatic chuck to be connected to a power source directly below the support body 1, as is the case with the third embodiment described above.

Preferably, if the support body 1 is made of aluminum, an anodic oxidation process should be carried out on the surface of the support body 1. In this case, an anodic oxidation layer forms cover means instead of the cover members 8b, 8c.

As thus has been described it should be clear that in accordance with the current invention, it is possible to prevent the generation of the impurities by the provision of the cover means and to prevent the wafer from suffering damages due to heat by the provison of the cooling means.

What is claimed is:

1. An electrostatic chuck for holding a work such as a specimen wafer by electrostatic forces, comprising:
   an electrostatic attraction body including an electrode and an insulator layer which contains and insulates said electrode, said insulator layer having an upper surface for attracting and securing the work;
   an electrically conductive support body for supporting a lower surface of said electrostatic attraction body, said support body having, at the center of the support body, a round protrusion on which the electrostatic attraction body is placed;
   channel means provided in at least in one said support body and said attraction body for passing a cooling medium to cool said electrostatic chuck;
   an electric connection portion for connecting said electrode with a power supply; and
   cover means provided at least on the same side as said electrostatic attraction body with respect to the support body, for covering exposed surfaces of the support body except a surface over which the electrostatic attraction body is positioned so that impure materials are prevented from being generated therefrom, said cover means being formed of a cover plate with an aperture in which the work is placed.

2. An electrostatic chuck as set forth in claim 1 in which said insulator layer of said electrostatic attraction body is formed of an organic resin layer such as a polyimide layer or a polyester layer with a thickness of 10 to 100 $\mu$m, and said electrode is made of a metallic film with a thickness of 10 to 50 $\mu$m.

3. An electrostatic chuck as set forth in claim 1 in which said insulator layer of said electrostatic attraction body is formed of an organic resin layer such as a polyimide layer or a polyester layer with the thickness of 10 to 100 $\mu$m, and said electrode is made of a metallic film formed by means of vacuum evaporation or spattering with a thickness of less than 2 $\mu$m.

4. An electrostatic chuck as set forth in claim 1 in which the cover means is made of a ceramic material.

5. An electrostatic chuck as set forth in claim 1 in which the cover means is made of a heat-resistant synthetic resin.

6. An electrostatic chuck as set forth in claim 1 in which the cover means is in the form of an anodic oxidation layer.

7. An electrostatic chuck as set forth in claim 1 in which the support body comprises a material with a high thermal conductivity such as copper or aluminum.

8. An electrostatic chuck as set forth in claim 1 in which the cover means is clamped upon the support body by means of a clamping member provided on a periphery of the cover means.

9. An electrostatic chuck as set forth in claim 1 in which the attracting surface of said electrostatic attraction body is smaller than a surface of the work to be attracted.

10. An electrostatic chuck as set forth in claim 1 in which said electrostatic attraction body further has an adhesive layer as a means to securely affix itself onto the support body.

11. An electrostatic chuck as set forth in claim 1 in which an electric connection portion is extended from a main body of said electrostatic attraction body outwardly between the cover means and the support body for connection with an external power source.

12. An electrostatic chuck as set forth in claim 1 in which an electric connection portion is extended outwardly from a main body of the electrostatic attraction body through said support body for connection to an external power source.

13. An electrostatic chuck as set forth in claim 1 in which the cover means is securely affixed onto the support body by means of an adhesive.

14. An electrostatic chuck as set forth in claim 1 in which the cover means is securely held onto the support body by means of screws.

15. An electrostatic chuck as set forth in claim 1 in which the cover means is simply placed upon the support body.

16. An electrostatic chuck for holding a work such as a specimen wafer by electrostatic forces, comprising:
   an electrostatic attraction body including an electrode and an insulator layer which contains and insulates said electrode, said insulator layer having an upper surface for attracting and securing the work;
   an electrically conductive support body for supporting a lower surface of said electrostatic attraction body, said support body having an annular groove for forming a protrusion on which the electrostatic attraction body is placed,
   channel means provided at least in one of said support body and attraction body for passing cooling medium therethrough to cool said electrostatic chuck;
   an electric connection portion for connecting said electrode with a power supply; and
   cover means provided at least on the same side as said electrostatic attraction body with respect to the support body, for covering exposed surfaces of the support body except a surface over which the electrostatic attraction body is positioned so that impure materials are prevented from being generated therefrom, said cover means comprising a cover ring placed in the groove of the support body and a cover plate for covering other surfaces of the support body except the groove.

* * * * *